US012640225B2

(12) United States Patent
Yang et al.

(10) Patent No.: US 12,640,225 B2
(45) Date of Patent: May 26, 2026

(54) MEMORY DEVICE WITH A STORAGE COMPONENT

(71) Applicant: Micron Technology, Inc., Boise, ID (US)

(72) Inventors: Lingming Yang, Meridian, ID (US); Raghukiran Sreeramaneni, Frisco, TX (US); Nevil N. Gajera, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 122 days.

(21) Appl. No.: 18/786,291

(22) Filed: Jul. 26, 2024

(65) Prior Publication Data

US 2025/0061960 A1 Feb. 20, 2025

Related U.S. Application Data

(60) Provisional application No. 63/533,326, filed on Aug. 17, 2023.

(51) Int. Cl.
*G11C 29/52* (2006.01)
*G11C 29/00* (2006.01)

(52) U.S. Cl.
CPC .............. *G11C 29/52* (2013.01); *G11C 29/76* (2013.01); *G11C 29/785* (2013.01)

(58) Field of Classification Search
CPC ..................................................... G11C 29/52
USPC ..................................................... 365/185.09
See application file for complete search history.

(56) References Cited

U.S. PATENT DOCUMENTS

| | | | |
|---|---|---|---|
| 2011/0249483 A1* | 10/2011 | Oh | G11C 5/02 365/194 |
| 2014/0043057 A1* | 2/2014 | Kim | G11C 29/1201 324/762.01 |
| 2014/0071771 A1 | 3/2014 | Hollis | |
| 2015/0106547 A1 | 4/2015 | King | |
| 2019/0385996 A1 | 12/2019 | Nakano et al. | |
| 2020/0195252 A1* | 6/2020 | Brewer | H10B 41/40 |
| 2020/0402567 A1* | 12/2020 | Ware | G11C 11/4093 |

(Continued)

FOREIGN PATENT DOCUMENTS

KR 20130131548 A 12/2013

OTHER PUBLICATIONS

International Application No. PCT/US2024/039513—International Search Report and Written Opinion, mailed Nov. 5, 2024, 9 pages.

*Primary Examiner* — Muna A Techane
(74) *Attorney, Agent, or Firm* — Dorsey & Whitney LLP

(57) ABSTRACT

A stacked memory device (e.g., a high-bandwidth memory (HBM) device) having a storage component is disclosed. The stacked memory device can include a first logic die, one or more memory dies, a second logic die, and one or more storage dies. The first logic die is coupled with the one or more memory dies and the second logic die through TSVs. The second logic die is coupled with the one or more storage dies through additional TSVs. The first logic die can issue commands to the one or more memory dies that cause the one or more memory dies to perform operations (e.g., read/write operations). The first logic die can also issue commands to the second logic die that cause the second logic die to issue commands to the one or more storage dies to perform operations.

20 Claims, 9 Drawing Sheets

(56) References Cited

U.S. PATENT DOCUMENTS

2023/0298631 A1* 9/2023 Park ........................ H01L 25/18
2024/0086345 A1* 3/2024 Kwon ................. G06F 13/1668

* cited by examiner

100

900

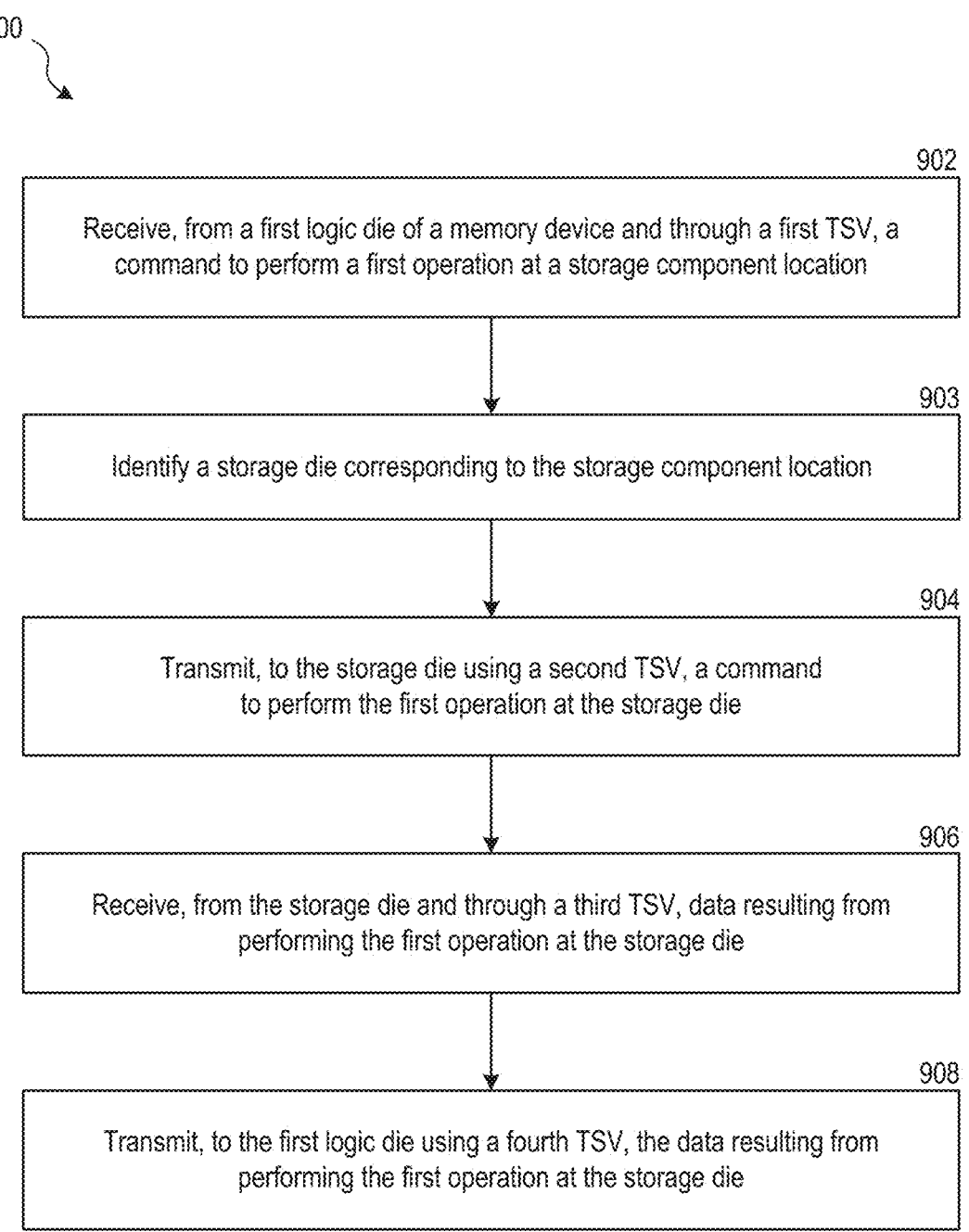

902

Receive, from a first logic die of a memory device and through a first TSV, a command to perform a first operation at a storage component location

903

Identify a storage die corresponding to the storage component location

904

Transmit, to the storage die using a second TSV, a command to perform the first operation at the storage die

906

Receive, from the storage die and through a third TSV, data resulting from performing the first operation at the storage die

908

Transmit, to the first logic die using a fourth TSV, the data resulting from performing the first operation at the storage die

*FIG. 9*

MEMORY DEVICE WITH A STORAGE COMPONENT

CROSS-REFERENCE TO RELATED APPLICATION(S)

The present application claims priority to U.S. Provisional Patent Application No. 63/533,326, filed Aug. 17, 2023, the disclosure of which is incorporated herein by reference in its entirety.

TECHNICAL FIELD

The present disclosure generally relates to memory devices and, more particularly, relates to a memory device with a storage component.

BACKGROUND

Computing devices include a storage system that can be used to store data to be operated on by a processor. Increasingly complex applications for computing devices require storage systems that enable faster, less expensive, and more reliable computing. Storage systems often have a hierarchical architecture that can be used to store data closer to or farther from a processor. A processor can receive data from lower-level storage, which retrieves data from higher-level storage. For example, a hierarchical storage system can include, from the lowest level to the highest level, a cache memory, a main memory (e.g., random-access memory (RAM)), and a storage device. In general, hierarchical layers implemented closer to the processor (e.g., lower levels) can be accessed more quickly but can have lesser capacities and be more costly to implement. Computing devices benefit from increasing the storage capacity at lower hierarchical levels; however, cost and spatial concerns can restrict such designs.

BRIEF DESCRIPTION OF THE DRAWINGS

FIG. 9 illustrates an example method for operating a memory device in accordance with an embodiment of the present technology.

DETAILED DESCRIPTION

Figure 1:
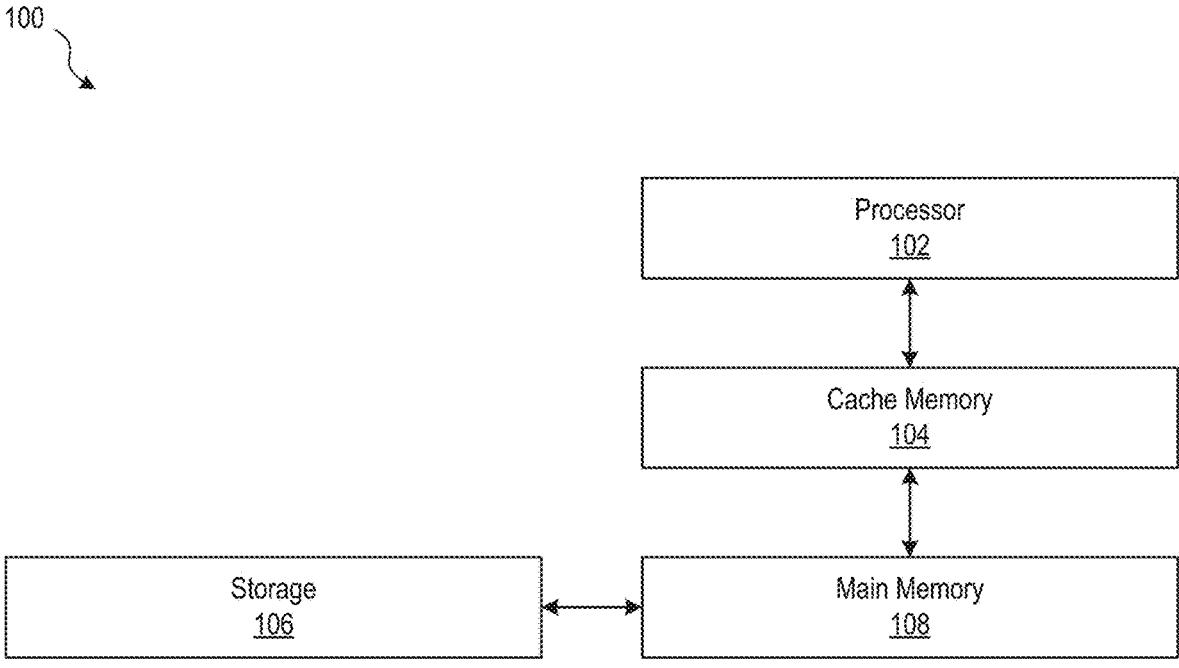
FIG. 1 illustrates an example schematic of a hierarchical storage architecture.

A computing device includes a storage system, which stores data to be operated on by a processor or other component of the host computing device. As applications for computing devices become more complex, storage systems that can store greater amounts of data and communicate that data more quickly with a host computing device are desired. Accordingly, techniques to improve the efficiency and overall capacity of memory devices are needed. Storage systems are often arranged in a hierarchical structure where data is stored closer to or further from the processor. The processor can request data from the storage system to perform various operations. As an example, FIG. 1 illustrates a hierarchical storage architecture 100 where a processor 102 accesses data from a cache memory 104, storage 106, and/or a main memory 108.

The cache memory 104 can store small amounts of data close to the processor 102 such that this data can be accessed with low latency. In some cases, the cache memory can include a high-speed, random-access memory (RAM), such as static RAM (SRAM). The cache memory 104 can include a single-level cache or a multilevel cache (e.g., a L1 cache, a L2 cache, etc.). In embodiments, the single-level cache and/or one or more levels of the multilevel cache may be part of the die of processor 102. Given that the cache memory 104 is located close to the processor 102 and communicates with low latency, communication efficiency is improved when the data requested by the processor 102 is stored in the cache memory 104 (e.g., a cache hit). If the requested data is not in the cache memory 104 (e.g., a cache miss), this data can be retrieved from the main memory 108 or the storage 106 and stored in the cache memory 104, from which the data can be accessed by the processor 102.

The main memory 108 can store a larger amount of data than the cache memory 104, though this data may be returned with higher latency. For example, the main memory 108 can include 8, 16, 24, or 48 Gigabytes (GB), or any other amount of a volatile memory, such as dynamic RAM (DRAM). Data can be stored in the main memory 108 to be retrieved and stored in the cache memory 104. When the requested data is not located in the cache memory 104 or the main memory 108, the data can be retrieved from storage 106. The storage 106 can include a high-latency, large-capacity storage device (e.g., non-volatile memory). For example, the storage 106 can include NOT-AND (NAND) Flash storage having a capacity of 500 GB, 1 Terabyte (TB), 2 TB, and so on. When data is retrieved from storage 106, it can be stored in the main memory 108 such that subsequent requests to access the data can be retrieved directly from the main memory 108 without having to access the storage 106, which can improve latency. When space is needed in the main memory 108 to store newly requested data, previously requested data can be overwritten.

The main memory 108 and the cache memory 104 can be connected through an interconnect, which can include any number of buses. Similarly, the storage 106 and the main memory 108 can be coupled through an interconnect, which can include any number of buses. In aspects, data can be communicated between the main memory 108 and the cache memory 104 with a higher bandwidth (e.g., 100, 200, 500, 800, 1000 GB/s) than data communicated between the storage 106 and the main memory 108 (2, 4, 6, 8, 10 GB/s). For example, the main memory 108 can include a high-bandwidth memory (HBM) device, coupled to the cache memory 104 through a high-bandwidth bus, that can communicate data at an increased bandwidth. In contrast, the interconnect between the storage 106 and the main memory 108 can be implemented on a printed circuit board (PCB) or interposer, which has limited space (e.g., less bandwidth). For example, the interconnect between the storage 106 and the main memory 108 can be a Peripheral Component Interconnect Express (PCIe) interface. Thus, the number or size of buses implemented between the storage 106 and the main memory 108 can be limited, thereby limiting the bandwidth at which data can be communicated between the storage 106 and the main memory 108.

Given the limited bandwidth of the storage 106 in comparison to the bandwidth of the main memory 108, retrieving data from the storage 106 can create a bottleneck and decrease computing speed. This bottleneck can become even more limiting at device start-up, when large amounts of data are transferred from non-volatile storage (e.g., storage 106) to the main memory 108 or the cache memory 104.

By increasing the capacity of the main memory 108, more data can be stored in the main memory 108 before being overwritten, thereby reducing the likelihood that the storage 106 needs to be accessed to retrieve requested data. Some techniques to increase the capacity of the main memory 108 may be overly costly, require too much space, or present thermal challenges. For example, additional memory dies (e.g., DRAM) may be overly costly for some applications or require large amounts of additional power. Moreover, the inclusion of additional dies can increase stack height beyond the allowable spatial constraints. In yet other aspects, large memory devices can produce large amounts of heat that current thermal systems are incapable of dissipating at the required rate.

To overcome these challenges and others, a stacked memory device with volatile memory dies (e.g., DRAM) and a storage component is disclosed. The storage component can include a storage controller die and one or more storage dies (e.g., non-volatile storage), such as NAND dies, NOR dies, or other forms of non-volatile storage. The storage dies can have a cell size smaller than the cell size of the memory dies, such that a storage die can have greater storage capacity than a memory die of the same size. In this way, the capacity of the memory device can be increased with minimal increase to the size of the memory device. Moreover, the storage dies can be less costly (e.g., financially or in power usage) than the memory dies and thus the storage dies can be used to increase the capacity of the memory device with limited cost increase. In yet another aspect, the storage dies can create a memory device having non-volatile storage, which can improve reliability and improve start-up speed. In some embodiments, the storage component can communicate at the same bandwidth as the memory dies. In this way, the storage component can provide additional storage that communicates data at a high bandwidth, thereby reducing bottlenecks due to mismatched bandwidths between the storage component and the memory dies. In aspects, the high bandwidth can be achieved by moving the interconnects between the logic die of the memory device and the storage component off of a spatially constrained PCB or interposer.

The memory device can include an interface die that transmits commands to one or more memory dies (e.g., volatile memory), such as DRAM dies, and a storage controller die of a storage component, which issues command to the one or more storage dies. The storage component can be used to expand the capacity of the memory device. In embodiments, the storage controller die of the storage component of the memory device can implement one or more operations. For example, the storage component can perform error correction code (ECC) operations using ECC code words stored within the one or more storage dies. Alternatively or additionally, the storage component can include spare storage dies that can be used to replace worn storage dies in the storage component, thereby improving the durability of the storage component.

The interface die of the stacked memory device can couple with the one or more memory dies and the storage controller die of the storage component using through-silicon vias (or through-substrate vias) (TSVs). Given that the memory dies and the storage component can communicate at the same bandwidth, the interface die of the memory die can issue similar commands to the one or more memory dies and the storage controller die. In some embodiments, the one or more memory dies and the storage controller die can couple to the interface die through common TSVs. In this case, the interface die can issue a single command to both the one or more memory dies and the storage component. That is, for example, the interface die can issue a write command (e.g., received from a host device) to one or more memory dies (such that the data is written to volatile memory) as well as the storage controller die (such that the data is written to non-volatile memory of one or more storage dies). Moreover, given that the interconnect is shared between the storage component and the memory dies, these components can communicate directly between one another without requiring data to pass through the logic die of the memory device. For example, data read from the storage component may be written to the memory dies, and data read from the memory dies may be written to the storage component, without the interface die receiving, buffering, retransmitting, etc. the data to be written.

Various aspects of a memory device with a storage component will be described with reference to FIGS. 2-9. The memory device can be a main memory or any other memory of a computing system. Moreover, the computing device can include additional storage beyond the storage component of the memory device. For example, the computing device can include additional volatile or non-volatile storage, such as Flash, solid state drives, and so on.

Example Operating Environment

Figure 2:
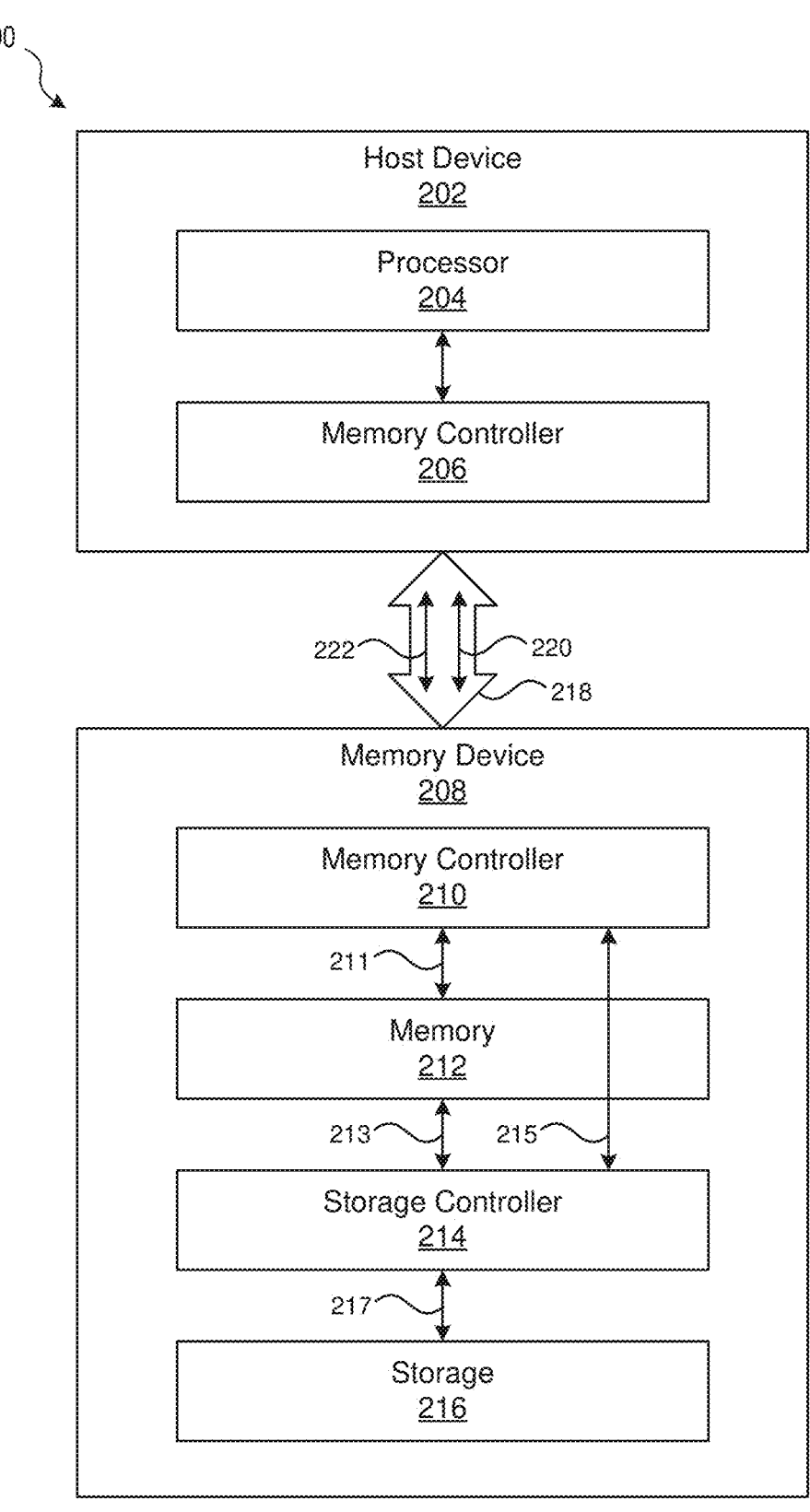
FIG. 2 illustrates an example computing device in which a memory device in accordance with an embodiment of the present technology can operate.

FIG. 2 illustrates an example computing device 200 in which a memory device in accordance with an embodiment of the present technology can operate. The computing device 200 includes a host device 202, which has at least one processor 204 and at least one memory controller 206, and a memory device 208, which includes a memory controller 210, memory 212, a storage controller 214, and storage 216. In some examples, memory controller 206 may be an aspect of, and may reside on or within, the processor 204. The memory controller 210 can include control logic that is capable of receiving commands from the host device 202 (e.g., the memory controller 206) and issuing commands to memory 212 or the storage controller 214. For example, the memory controller 210 can be an independent logic die, such as an interface die implemented in an HBM device, or integrated with one or more of the memory 212, the storage controller 214, or the storage 216. The storage controller 214 can receive commands from the memory controller 210 and, based on these commands, issue commands to the storage 216 to perform one or more operations.

In aspects, the components of the memory device 208 can be coupled with TSVs. For example, the memory controller 210 can connect to the memory 212 through TSVs 211, memory 212 can connect to storage controller 214 through TSVs 213, and the memory controller 210 can connect to the storage controller 214 through the TSVs 215. In some implementations, the TSVs 211, TSVs 213, and TSVs 215 can be implemented as a common set of TSVs that communicate signals between the memory controller 210 and the memory 212 or the storage controller 214. In other cases, the TSVs 211 and TSVs 215 can be discrete sets of TSVs such that the TSVs 211 communicate signals between the memory controller 210 and the memory 212 and the TSVs 215 communicate signals between the memory controller 210 the storage controller 214. A separate set of TSVs 217 can be used to communicate signals between the storage controller 214 and the storage 216.

The computing device 200 further includes an interconnect 218. The computing device 200 can be any type of computing device, computing equipment, computing system, or electronic device, for example, hand-held devices (e.g., mobile phones, tablets, digital readers, and digital audio players), computers, vehicles, or appliances. Components of the computing device 200 may be housed in a single unit or distributed over multiple, interconnected units (e.g., through wired or wireless interconnects). In aspects, the host device 202 and the memory device 208 are discrete components mounted to and electrically coupled through an interposer, PCB, or other organic or inorganic substrate (e.g., implementing a portion of the interconnect 218).

As shown, the host device 202 and the memory device 208 are coupled with one another through the interconnect 218. The processor 204 executes instructions that cause the memory controller 206 of the host device 202 to send signals on the interconnect 218 that control operations at the memory device 208. The memory device 208 can similarly communicate data to the host device 202 over the interconnect 218. The interconnect 218 can include one or more command-address (CA) buses 220 and one or more data (DQ) buses 222. The CA buses 220 can communicate control signaling indicative of commands to be performed at select locations (e.g., addresses) of the memory device 208. The DQ buses 222 can communicate data between the host device 202 and the memory device 208. For example, the DQ buses 222 can be used to communicate data to be stored in the memory device 208 in accordance with a write request, data retrieved from memory device 208 in accordance with a read request, or an acknowledgment returned from the memory device 208 in response to successfully performing operations (e.g., a write operation) at the memory device 208. The CA buses 220 can be realized using a group of wires, vias, or other circuit components, and the DQ buses 222 can encompass a different group of wires, vias or other circuit components of the interconnect 218. As some examples, the interconnect 218 can include a front-side bus, a memory bus, an internal bus, a peripheral control interface (PCI) bus, etc.

The processor 204 can read from and write to the memory device 208 through the memory controller 206. The processor 204 may include the computing device's host processor, central processing unit (CPU), graphics processing unit (GPU), artificial intelligence (AI) processor (e.g., a neural-network accelerator), or other hardware processor or processing unit.

The memory device 208 can be integrated within the host device 202 or separate from the computing device 200. The memory device 208 can include any memory 212, such as integrated circuit memory, dynamic memory, RAM (e.g., DRAM or SRAM), or Flash memory, to name just a few. The memory device 208 can further include any amount of memory 212 (e.g., 8 GB, 16 GB, 32 GB, or 64 GB). In aspects, the memory 212 includes volatile memory. The memory device 208 can include memory 212 of a single type or memory 212 of multiple types. In general, the memory device 208 can be implemented as any addressable memory having identifiable locations of physical storage. The memory device 208 can include the memory-side memory controller 210, which executes commands from the memory controller 206. For example, the memory controller 210 can decode signals from the memory controller 206 and issue command to cause operations to be performed at the memory 212. Commands can be issued along CA buses, and data can be returned along DQ buses. The CA buses or DQ buses can be implemented using TSVs (e.g., TSVs 211, 213, 215, and 217).

As illustrated, the memory device 208 further includes the storage controller 214 and the storage 216. The storage controller 214 can include control logic configured to receive commands from the memory controller 210 and, based on these commands, issue commands to the storage 216. The storage controller 214 can be implemented on an independent die or in combination with the storage 216. The memory controller 210 can couple with the storage controller 214 through CA buses and DQ buses (e.g., implemented at least partially using TSVs 211, 213, or 215). In aspects, the memory controller 210 and storage controller 214 can communicate through CA buses and DQ buses also shared with the memory 212. In this way, the memory controller 210 can issue commands to the memory 212 and the storage controller 214 alike, and data can be passed between the storage controller 214 and the memory 212 without additional involvement from the memory controller 210. In other cases, the memory 212 and the storage controller 214 can each include their own discrete CA buses or DQ buses to the memory controller 210.

In general, the memory controller 210 can communicate with the memory 212 and the storage controller 214 similarly. For instance, the memory controller 210, the memory 212, and the storage controller 214 can communicate at a common bandwidth (e.g., 250, 500, 1000, 1500, or 2000 GB/s). Similarly, the storage controller 214 and the storage 216 can communicate at the common bandwidth (e.g., 250, 500, 1000, 1500, or 2000 GB/s). By implementing the storage controller 214 and the storage 216 within the memory device 208, the interconnect through which the storage controller 214 communicates with other components of the memory device (e.g., the memory controller 210) can similarly be moved within the memory device 208 (e.g., utilizing TSVs 211, 213, or 215 through the memory device 208). By moving the interconnect between the storage controller 214 and other components of the memory device 208 off board (e.g., off a PCB on which are disposed a conventional memory device and storage, such as illustrated in FIG. 1) and instead integrating the interconnect within the memory device 208, the spatial constraints of the interconnect are reduced, thereby enabling a storage device that can communicate with the memory 212 with increased bandwidth. Thus, the storage 216 can expand the capacity of the memory device 208 without creating a communication bottleneck due to mismatched communication bandwidths.

The storage 216 can couple to the storage controller 214 through one or more CA buses and DQ buses (e.g., implemented using TSVs 217). The CA buses and DQ buses can be different from the CA buses and DQ buses connecting the storage controller 214 to the memory controller 210 (e.g., implemented using TSVs 211, 213, or 215). In this way, the storage controller 214 can act as a facilitator or buffer between the storage 216 and the memory controller 210. The storage 216 can include any type of storage device, such as NAND storage, NOT-OR (NOR) storage, and so on. In aspects, the storage 216 includes non-volatile storage (e.g., NAND Flash storage). The storage 216 can include any number of storage devices with any capacity. For example, the storage 216 can include 32, 64, 128, 264 GB, or 1 TB of storage. The storage 216 can, but need not, function as the main storage for the computing device 200. For example, the computing device 200 can include additional storage, as illustrated in FIG. 1, not illustrated in FIG. 2. Thus, the storage 216 can function as an extension of the memory device 208 rather than a main storage for the computing device 200. The storage 216 can further include additional storage devices to perform one or more functions. For example, the storage 216 can include ECC dies to perform error correction operations, spare dies to replace worn dies, one or more storage dies to implement a buffer, and so on.

In some implementations, the storage 216 can be used to provide non-volatile storage of the data held in the memory 212. For example, when data is written to memory 212, it can also be written to storage 216. In this way, a reliable copy of data can be maintained even when the data stored in the memory 212 is corrupted (e.g., due to an attack or loss of power). Moreover, the non-volatile copy of the data stored in storage 216 can be used to reload the data back into memory 212 at start-up. Given that the storage 216 can communicate at a similar bandwidth as the memory 212 and the memory controller 210, start-up speed can be improved relative to the start-up speed of a device that loads data from a separate storage (e.g., storage 106 of FIG. 1).

In some implementations, the storage 216 can function to increase the capacity of the memory device 208. For example, data that is written to or flushed from memory 212 can be stored in the storage 216. Once the data is flushed from memory 212, it must be loaded back to memory 212 when requested. In previous devices, the data would be loaded from an off-device storage (e.g., storage 106 of FIG. 1), which may communicate with the memory controller 210 at a lower bandwidth than the internal (e.g., between the memory controller 210 and memory 212) bandwidth of the memory device 208. In accordance with aspects of the present technology, however, the storage 216 can maintain this data, which enables the data to be loaded into the memory 212 from the storage 216. Given that the storage 216 can communicate at an increased bandwidth (e.g., at the internal bandwidth of the memory device 208), this data can be loaded more efficiently compared to previous devices.

The memory device 208 can be configured in any number of ways. As a specific example, the memory device 208 can be implemented as an HBM device. For example, the memory device 208 can include a vertical stack of different logic dies, memory dies, and storage dies, including an interface die implementing at least a portion of the memory-side memory controller 210 and one or more of memory 212 (e.g., memory dies), a storage controller 214, and storage 216 stacked to the interface die. The memory-side memory controller 210 can receive commands from the memory controller 206 through the interconnect 218 and communicate signaling to execute the commands at the memory 212 or the storage controller 214 in an improved manner, compared to other memory devices (e.g., with a higher bandwidth). The interconnect 218 can similarly be implemented in accordance with an HBM specification (e.g., the memory device 208 may be an HBM3 device, an HBM4 device, etc., and the interconnect may 218 may comply with the relevant HBM specification). For example, the interconnect 218 can include 32 channels further divided into two pseudo channels per channel. Each channel can be coupled to a CA bus, and each pseudo channel can transmit or receive data through a DQ bus. In some embodiments, the DQ bus of each pseudo channel can be a bus different from the DQ buses of the other pseudo channels of the same channel. In some embodiments, the DQ bus of each pseudo channel can be associated with different portions of the DQ bus of an associated channel. Thus, in some embodiments, the interconnect 218 can include twice as many DQ buses 222 (e.g., 64 DQ buses) as CA buses 220 (e.g., 32 CA buses). And in some embodiments, the interconnect 218 can include the same number of DQ buses 222 (e.g., 32 buses) as CA buses 220 (e.g., 32 CA buses), where each DQ bus is split into separate portions to be used by the channel's pseudo channels (e.g., a DQ bus 222 is split into an upper portion and a lower portion). In aspects, the interconnect 218 can include a single data rate (SDR) or double data rate (DDR) bus.

Example System-in-Package (SiP)

Figure 3:
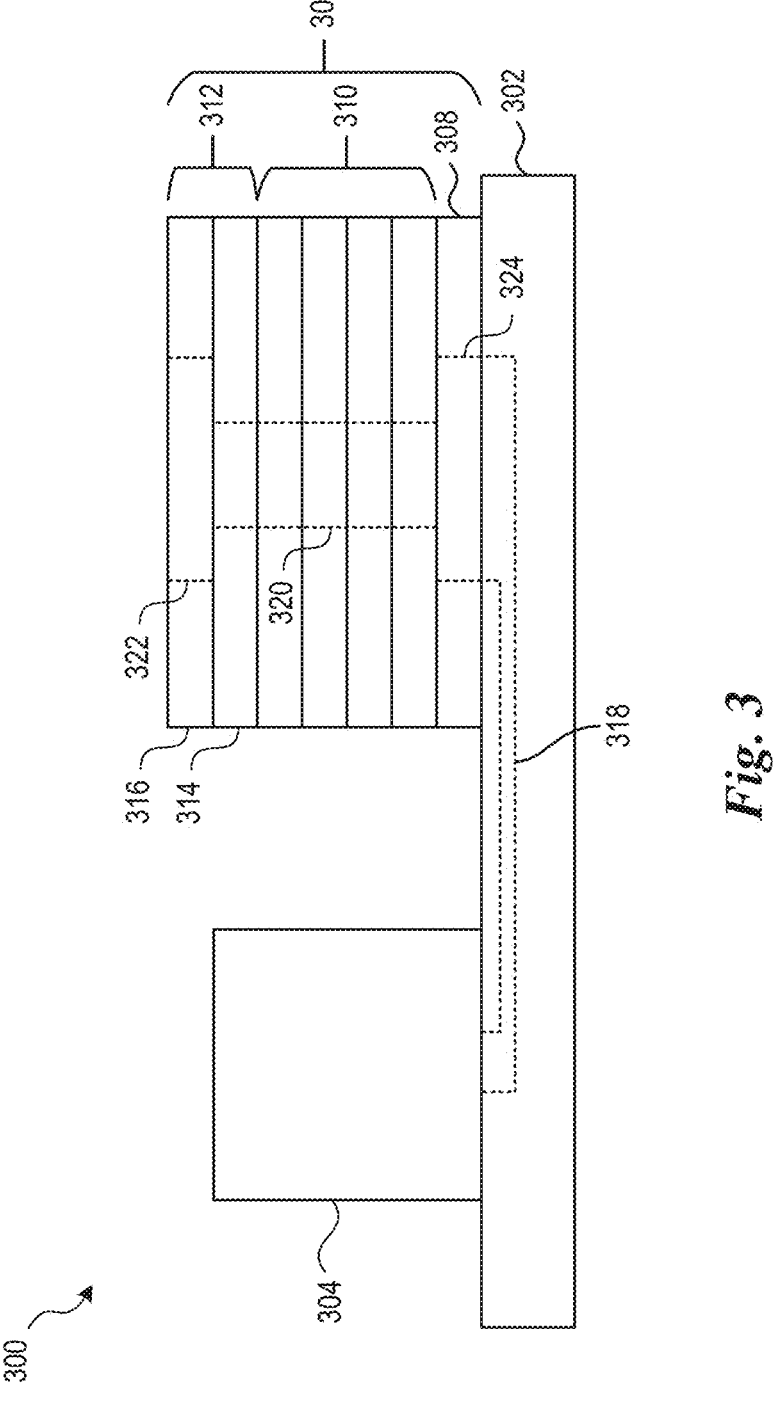
FIG. 3 illustrates an example system-in-package (SiP) that includes a memory device in accordance with an embodiment of the present technology.

FIG. 3 illustrates an example system-in-package (SiP) 300 that includes a memory device in accordance with an embodiment of the present technology. As illustrated in FIG. 3, the SiP device 300 includes a base substrate 302 (e.g., a silicon interposer, a PCB, an organic or inorganic substrate, and/or the like), as well as a CPU/GPU 304 (e.g., an example of processor 204 illustrated in FIG. 2) and the combined HBM device 306 each integrated at an upper surface of the base substrate 302. In the illustrated embodiments, the CPU/GPU 304, and associated components (e.g., the register, L1 cache, and the like) is illustrated as a single package, and the combined HBM device 306 includes a stack of semiconductor dies. The stack of semiconductor dies in the combined HBM device 306 includes an interface die 308 (e.g., an example of the memory controller 210 illustrated in FIG. 2), one or more volatile memory dies 310 (four illustrated in FIG. 3) (e.g., an example of the memory 212 illustrated in FIG. 2), and a storage component 312, which includes a storage controller 314 (e.g., an example of the storage controller 214 illustrated in FIG. 2) and one or more non-volatile memory dies 316 (one illustrated in FIG. 3) (e.g., an example of the storage 216 illustrated in FIG. 2). The CPU/GPU 304 is coupled to the combined HBM device 306 through a high bandwidth bus that includes one or more route lines 318 (two illustrated schematically in FIG. 3) formed into (or on) the base substrate 302. In various embodiments, the route lines 318 can include one or more metallization layers formed in one or more redistribution layers (RDLs) of the base substrate 302 and/or one or more vias interconnecting the metallization layers and/or traces. Further, although not illustrated in FIG. 3, it will be understood that the CPU/GPU 304 and the combined HBM device 306 can each be coupled to the route lines 318 via solder structures (e.g., solder balls), metal-metal bonds, and/or any other suitable conductive bonds. That is, the high bandwidth bus of the base substrate 302 can couple the CPU/GPU 304 to the combined HBM device 306, and any buses therein (e.g., an internal high bandwidth bus within the combined HBM device 306).

As discussed in more detail below, the internal high bandwidth bus of the combined HBM device 306 can include a plurality of TSVs 320 (e.g., an example of the TSVs 211, 213, or 215 discussed in FIG. 2) extending from the interface die 308, through the volatile memory dies 310, to the storage component 312. The storage component 312 further includes TSVs 322 (e.g., an example of the TSVs 217 of FIG. 2) extending between the storage controller 314 and the non-volatile memory dies 316. Routing circuitry at the storage controller 314 can extend between the TSVs 320 and the TSVs 322, thereby coupling high bandwidth buses of the combined HBM device 306 (e.g., from the interface die 308 to the storage component 312, and within the storage component 312) to each other. The TSVs 320 and the TSVs 322 enable each of the dies to communicate data within the combined HBM device 306 (e.g., between the volatile memory dies 310 (e.g., DRAM dies) and the non-volatile memory dies 316 (e.g., NAND dies)) at a relatively high rate (e.g., on the order of 1000 GB/s or greater). Additionally, the combined HBM device 306 can include one or more signal route lines 324 (e.g., additional TSVs extending through the interface die 302) that coupled the interface die 308 and/or the TSVs 320 to the route lines 318 (e.g., to the high bandwidth bus formed in the base substrate 302). In turn, the signal route lines 324, TSVs 320, the TSVs 322, and route lines 318 allow the dies in the combined HBM device 306 and the CPU/GPU 304 to communicate data at the high bandwidth.

The storage controller 314 can be responsible for managing one or more operations of the storage component 312. For example, at least a portion of the storage controller 314 or the non-volatile memory dies 316 can implement a buffer that can store data for future transmission to the non-volatile memory dies 316, the volatile memory dies 310, or the interface die 308. Thus, the storage controller 314 can control the transmission of data or control signaling to the other dies within the combined HBM device 306.

In some embodiments, the storage controller 314 can perform wear leveling by assigning some of the non-volatile memory dies 316 as active dies and others as inactive (spare) dies and cycling the assignments over time based on wear levels. In some cases, the non-volatile memory dies 316 have a shorter lifespan than the volatile memory dies 310. Thus, to align the lifespan of the various components of the combined HBM device 306, spare dies can be implemented within the non-volatile memory dies 316 to replace one or more of the active dies once the dies have experienced a threshold level of wear. The replacement of a previously active die with a spare die can be managed by the storage controller 314 (e.g., by mapping logical addresses previously associated with physical addresses of the previously active die to physical addresses of the replacement spare die).

In yet other aspects, the storage controller 314 can manage ECC operations performed in the storage component 312. For example, at least a portion of the non-volatile memory dies 316 can store ECC data that can be used to perform error correction. When data stored in the non-volatile memory dies 316 becomes corrupted (e.g., due to attacks or faults), the ECC data can be used to detect or correct the corruption. The storage controller 314 can issue commands to the non-volatile memory dies 316 to return the ECC data, which can be used to perform error correction.

Example Memory Die

Figure 4:
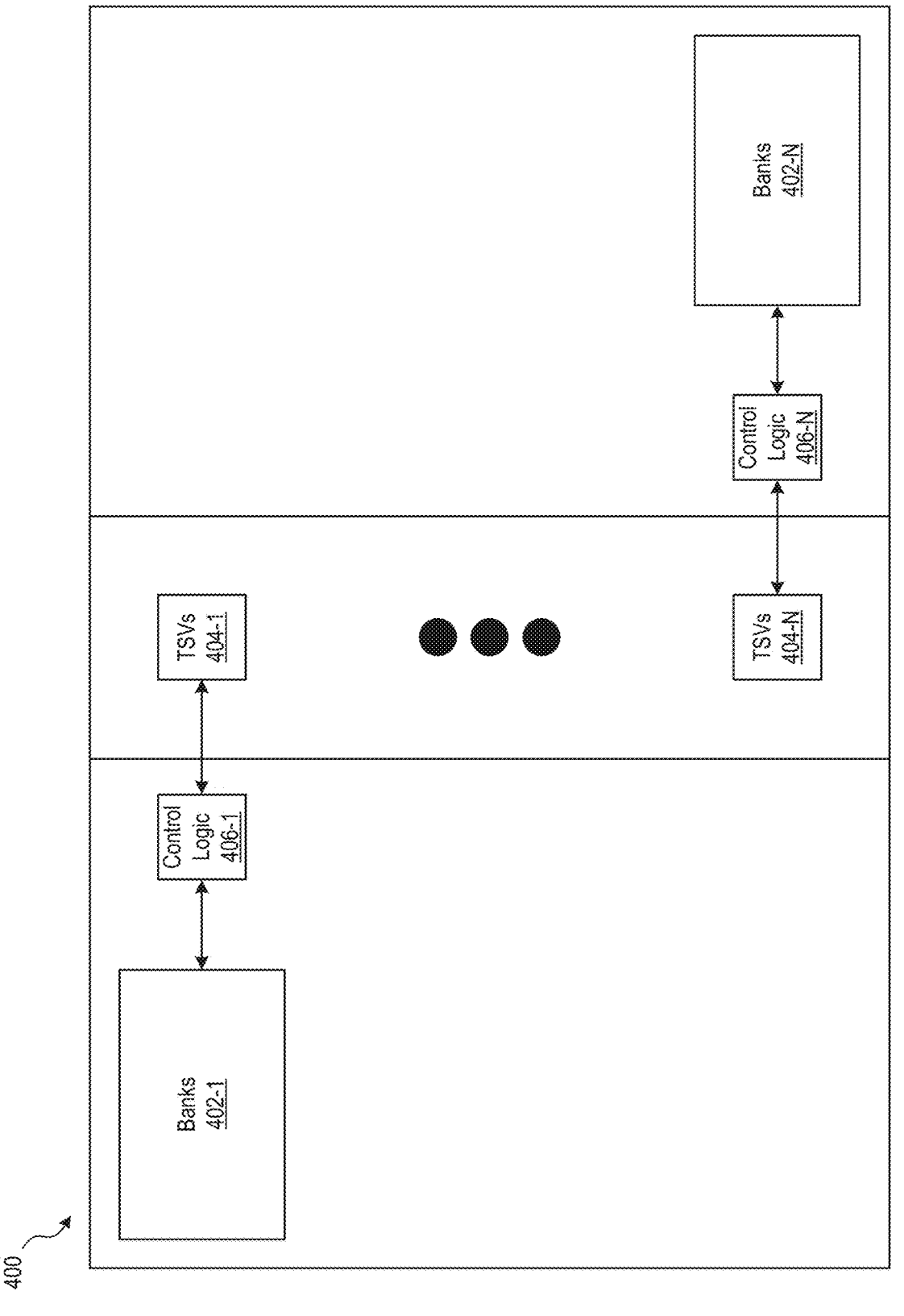
FIG. 4 illustrates an example memory die in accordance with an embodiment of the present technology.

FIG. 4 illustrates an example memory die 400 in accordance with an embodiment of the present technology. The memory die 400 can implement at least a portion of a device memory (e.g., memory 212 of FIG. 2). Although described as a memory die, storage dies (e.g., storage 216 of FIG. 2) can be implemented similarly to the memory die 400. The memory die 400 includes memory banks 402 (e.g., memory banks 402-1 through memory banks 402-N). The memory banks 402 couple to TSVs 404 (e.g., TSVs 404-1 through TSVs 404-N), which can provide a command interface (e.g., a CA bus), a data interface (e.g., DQ buses), and other interfaces and/or signaling. The memory banks 402 can be organized into channels and pseudo channels. Each of the channels can couple with a corresponding CA bus, and each of the pseudo channels can transmit/receive data to/from a corresponding DQ bus. As illustrated, memory banks 402-1 couple with a CA bus and one or more DQ buses implemented in TSVs 404-1, and memory banks 402-N couple with a CA bus and one or more DQ buses implemented in TSVs 404-N.

Control logic 406 (e.g., control logic 406-1 through control logic 406-N) can be implemented for each of the channels between the TSVs 404 and the memory banks 402 to control communication signaling between the memory banks 402 and the TSVs 404. In aspects, the control logic 406 can be used to decode and analyze commands transmitted through the CA bus of TSVs 404 to initiate the performance of operations (e.g., reads or writes) at the memory banks 402. The control logic 406 can route return data resulting from operations at memory banks 402 to a corresponding DQ bus implemented in the TSVs 404.

The memory die 400 can perform operations in accordance with commands received from a memory controller (e.g., memory controller 206 of FIG. 2). A memory controller command received by the memory die 400 can be directed to a channel (and the memory banks associated with that channel) and/or to a pseudo channel subdivided from the channel (and the memory banks associated with that pseudo channel) and received over the command interface associated with the channel. For example, the control logic 406 can receive a command to implement a read or write operation at the memory banks 402 through the CA bus implemented within the TSVs 404. The command can include one or more bits (e.g., in a header) that indicate a targeted rank (e.g., targeted die) and a target pseudo channel or bank to which the command is directed.

As described further herein, the TSVs 404 can be shared by other memory dies that implement the same corresponding channel (e.g., when a channel is associated with memory banks on multiple memory dies) and pseudo channels. For example, a second memory die (not shown) or a storage die/storage controller (not shown) implementing a same channel as the banks 402-1 can connect to the same TSVs 404-1 illustrated in FIG. 4. As a result, like pseudo channels on corresponding channels of multiple ranks or memory/storage dies return data on the same DQ buses. To prevent contention on the DQ buses, only a single rank of a same pseudo channel can return data at any one time. The control logic 406 can receive a command transmitted over the CA bus to which it is coupled and determine if the command targets the memory die 400 (e.g., or rank in which memory die 400 is implemented). If so, the control logic 406 can decode the command and transmit signals to targeted memory banks 402 of the channel. If not, the command can be ignored by the control logic 406.

Once the command is determined to be directed to the memory die 400, the command on a CA bus associated with the channel can be analyzed to determine which of the memory banks 402 are targeted by the command. The control logic 406 can analyze the command and determine, based on the one or more bits identifying the targeted memory banks and/or pseudo channel, to which of the memory banks 402 to transmit signaling to perform the operations indicated by the command. Accordingly, the control logic 406 can decode the command to determine a targeted row, a targeted column, and a desired operation associated with the command. The control logic 406 can then forward signaling to the targeted memory banks 402 to perform the desired operation at the targeted row and column.

Performing operations at the memory banks 402 can cause data to be returned to the control logic 406 for output to the memory controller. For example, if the operation is a read operation, the return data can include data stored in the targeted row and column of the memory banks 402. Alternatively, if the operation is a write operation, the data can include an acknowledgment (e.g., a success flag or a return of the data that was written) of a successful write operation at the targeted row and column of the memory banks 402. Once routed to the associated DQ bus of the TSVs 404, the return data can be transmitted to the memory controller using the associated DQ bus.

Although not illustrated, the memory die 400 can include pass-through TSVs, which are implemented through the memory die 400 but do not connect to banks 402 on the memory die 400. Instead, the pass-through TSVs can be used to communicate signaling to other dies stacked onto the memory die 400 (e.g., other memory dies, storage dies, storage controller dies, and/or other dies a vertically stacked memory device such as an HBM device).

Although illustrated as a single component of control logic, the control logic 406 associated with the various channels can be implemented as discrete portions of control logic. For example, the control logic 406 can be implemented at any location on or off the memory die 400 (e.g., at an interface die of the memory device). In aspects, portions of the control logic 406 can be implemented at different locations. For example, a portion of the control logic 406 responsible for decoding the command or determining the targeted memory banks/dies can be separate from a portion of the control logic 406 responsible for routing the return data to an associated DQ bus. Accordingly, it should be appreciated that the control logic 406 is shown schematically in FIG. 4 as a single component associated with each of the channels for ease of description only.

Example Memory Device

Figure 5:
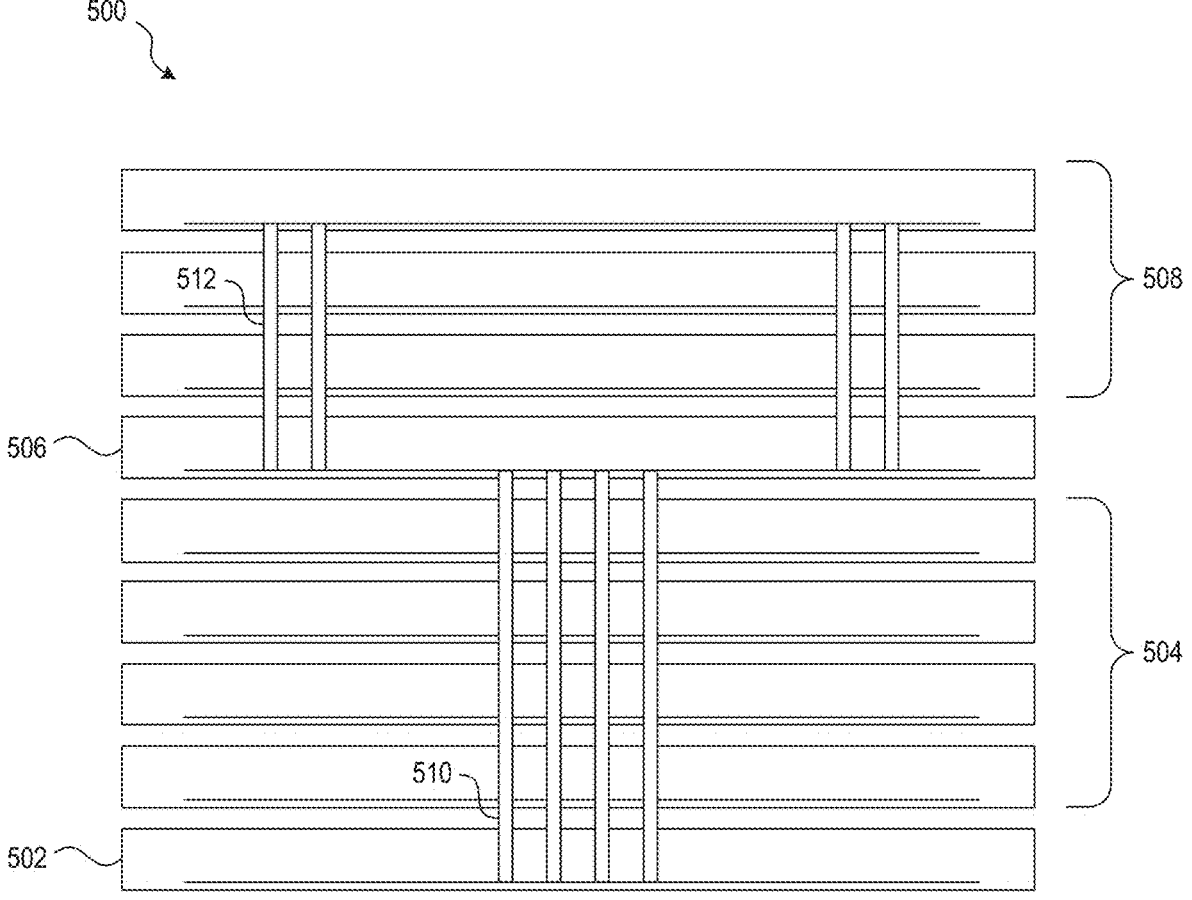
FIG. 5 illustrates a side view of an example memory device in accordance with an embodiment of the present technology.
Figure 6:
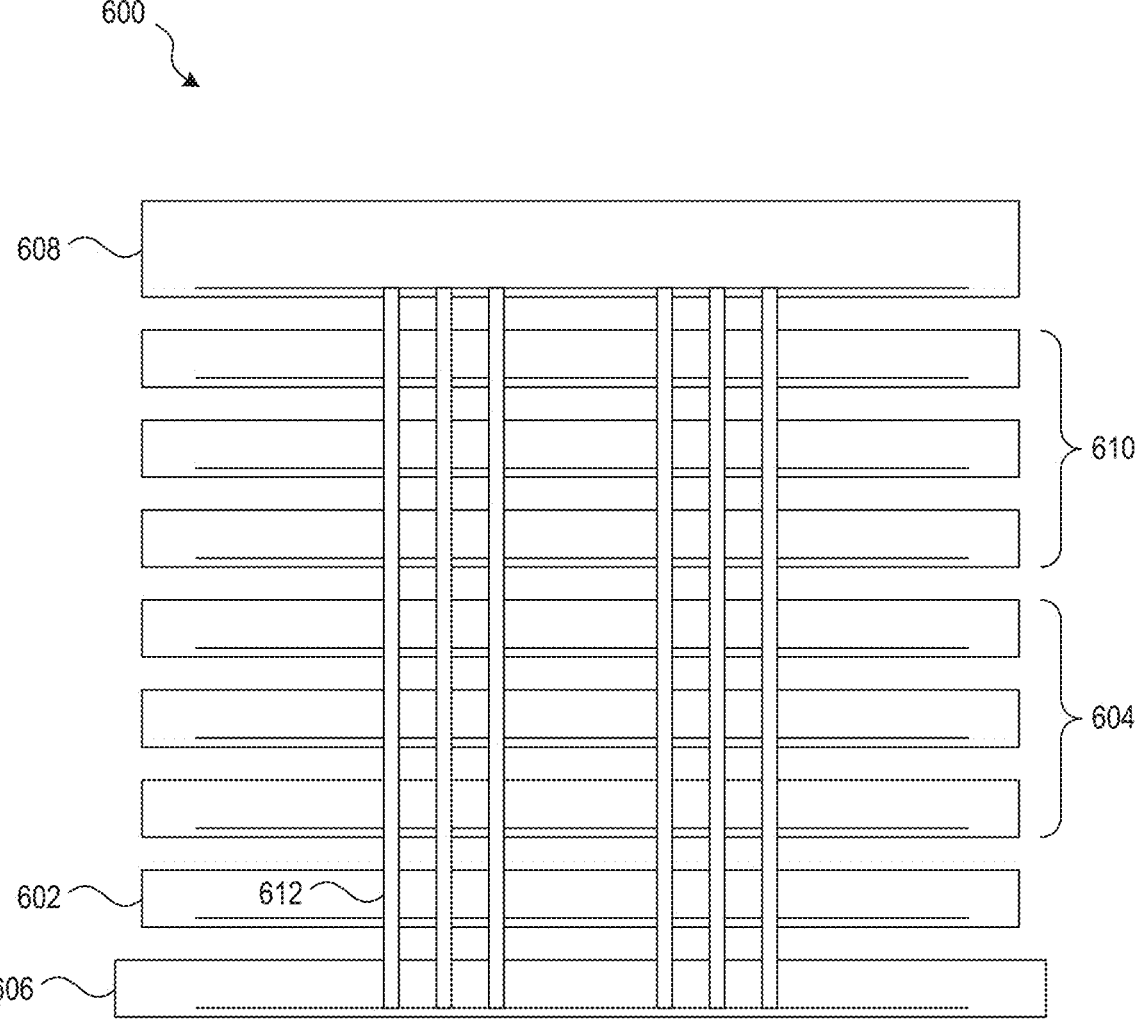
FIG. 6 illustrates a side view of an example storage component of a memory device in accordance with an embodiment of the present technology.
Figure 7:
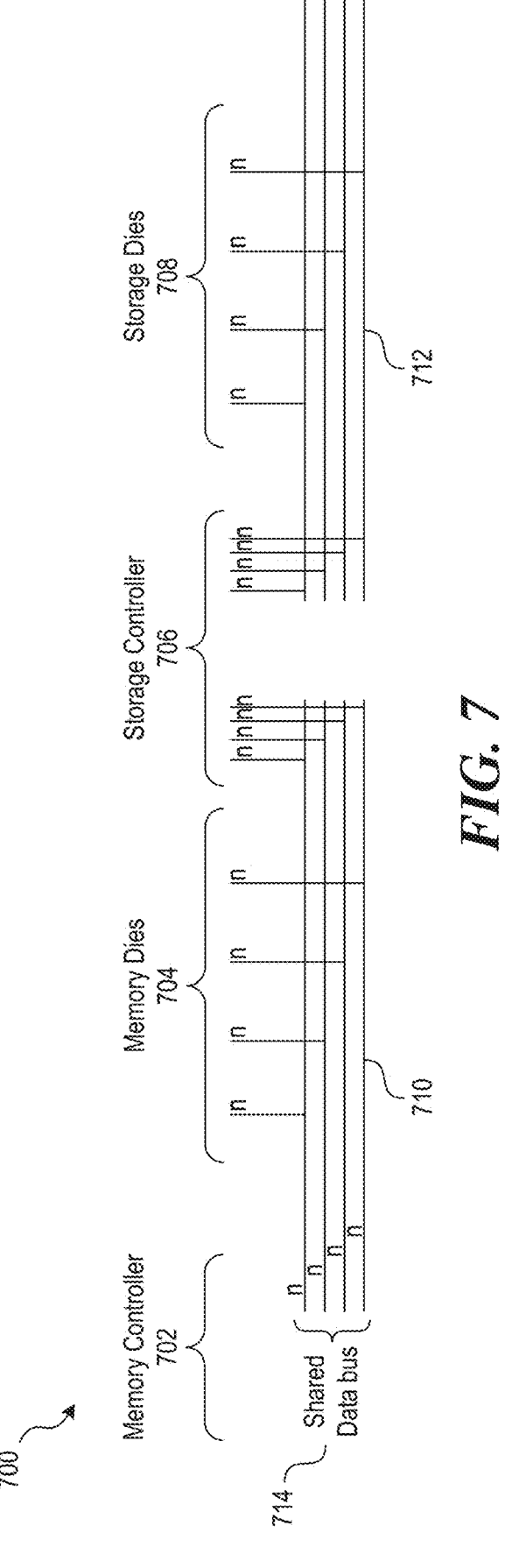
FIG. 7 illustrates an example schematic routing diagram of a memory device in accordance with an embodiment of the present technology.

FIG. 5 illustrates a side view of an example memory device 500 (e.g., an example of the memory device 208 illustrated in FIG. 2 and/or an example of the combined HBM device 306 illustrated in FIG. 3) in accordance with an embodiment of the present technology. As illustrated the memory device 500 includes a stack of semiconductor dies, including a memory controller 502 (e.g., an example of the memory controller 210 illustrated in FIG. 2), memory dies 504 (e.g., an example of memory 212 illustrated in FIG. 2), a storage controller 506 (e.g., an example of the storage controller 214 illustrated in FIG. 2), and storage dies 508 (e.g., an example of the storage 216 illustrated in FIG. 2). The memory controller 502 is coupled with the memory dies 504 and the storage controller 506 through TSVs 510, and the storage controller 506 couples to the storage dies 508 through TSVs 512. Although illustrated as a single set of TSVs connecting the memory controller 502 to both the memory dies 504 and the storage controller 506, the TSVs 510 can be divided into two sets of TSVs: a first set connecting the memory controller 502 to the memory dies 504 and a second set connecting the memory controller 502 to the storage controller 506. The TSVs 510 can implement CA buses and DQ buses used to communicate commands and data, respectively. The TSVs 510 need not connect to circuitry (e.g., banks) on each of the memory dies 504. Instead, respective groups of the TSVs 510 can connect to respective dies of the memory dies 504 and the remaining TSVs can pass through these respective dies, as illustrated in FIGS. 6 and 7. Though the TSVs 510 may not connect to circuitry at every one of the memory dies 504, in some embodiments, all of the TSVs 510 can connect to circuitry at the storage controller 506.

The memory controller 502 can communicate commands to the memory dies 504 to cause the memory dies to perform operations. For example, the memory controller 502 can issue a command to perform a write operation at one or more of the memory dies 504. The command can include a location at which data is to be written to one or more of the memory dies 504, and the data can be carried by the DQ bus. Targeted memory dies of the memory dies 504 can perform the operations and return an acknowledgment of a successful write operation. The acknowledgment can be returned to the memory controller 502 (e.g., on the DQ bus). In another example, the memory controller 502 can issue a command to perform a read operation at one or more of the memory dies 504. The command can include a location at which the data is to be read from. Targeted memory dies of the memory dies 504 can perform the read operation and return the data that has been read from the targeted location to the memory controller 502 (e.g., on the DQ bus).

The memory controller 502 can similarly issue commands to the storage controller 506. For example, the storage controller 506 can receive commands from the memory controller 502 that cause operations to be performed at the storage dies 508. As discussed above, the storage controller 506 can communicate at a same bandwidth as the memory controller 502 and the memory dies 504. Thus, similar commands can be issued to the memory dies 504 and the storage controller 506. The storage controller 506 can receive the commands from the memory controller 502 through the TSVs 510 and issue commands to one or more of the storage dies 508 through the TSVs 512. For example, the storage controller 506 can determine the location of the requested data, the proper scheduling to transmit the command to the storage dies 508, or any other aspect of communication. In embodiments, to determine the location of the requested data, the storage controller 506 may evaluate a location or address provided by the memory controller 502 and determine in which storage dies 508 the requested data is located. The determination by the storage controller 506 may be based on address translation, for example in response to wear leveling, bad storage die replacement, utilizing a redundant storage die, etc. In this way, managing one or more aspects of operations at the storage dies 508 can be offloaded from the memory controller 502 to the storage controller 506. Moreover, the storage controller 506 can manage additional features provided by the storage dies 508, allowing for backward compatibility (or near-backward compatibility) with previous designs of the memory controller 502.

Although the storage controller 506 can communicate at a same bandwidth as the memory dies 504, the storage dies 508 may have a higher latency than the memory dies 504. For example, the storage dies 508 can include NAND Flash dies that have higher latency than the DRAM dies of the memory dies 504. In this way, the storage controller 506 can be used to buffer return data resulting from operations at the storage dies 508 to return the data without interfering with data returned by the memory dies 504. For example, the memory dies 504 and the storage controller 506 can share DQ buses. As a result, a DQ bus coupled to one of the memory dies 504 and the storage controller 506 can only return data from one source at a time. Thus, the storage controller 506 can perform buffering to ensure that the DQ bus is clear before returning the data to the memory controller 502. Commands from the memory controller 502 can similarly be buffered to reduce contention in the storage dies 508.

The storage controller 506 can further control one or more operations of the storage dies 508 to improve efficiency, durability, or reliability of the storage dies 508. For example, the storage controller 506 can perform error correction, wear leveling, or implement any other technologies within the storage system. As described further with respect to FIG. 6, the storage dies 508 can include one or more dies to provide at least a portion of these features.

FIG. 6 illustrates a side view of an example storage component 600 of a memory device in accordance with an embodiment of the present technology. The storage component 600 can, for example, be an example of the storage component 312 illustrated in FIG. 3, the storage component of FIG. 5 (formed by storage controller 506 and storage dies 508), etc. As illustrated, the example storage component 600 includes a storage controller 606 coupled to one or more semiconductor dies through the TSVs 612. The one or more semiconductor dies include a buffer die 602 (e.g., a DRAM die or SRAM die), core storage dies 604, spare storage dies 610, and an ECC die 608. Although a specific configuration of semiconductor dies is illustrated, it is appreciated that this is but one configuration, and other configurations exist that include additional semiconductor dies, omit one or more of the illustrated semiconductor dies, combine components of the one or more semiconductor dies, or separate one or more components of the one or more semiconductor dies.

The core storage dies 604 can include one or more storage dies used to store data. The storage dies can include non-volatile storage, such as NAND Flash storage. The core storage dies 604 can represent the storage capacity of the storage component 600. For instance, the core storage dies 604 can include 8, 16, 32, 64, 128, or 256 GB of storage to name just a few options.

The storage dies used for data storage can be altered based on the wear levels of the storage dies. In a no-wear state, the core storage dies 604 can be active storage dies used to store data. In some cases, the storage dies have a shorter lifespan than the memory dies. Thus, to align the lifespan of the various components of the memory device, spare storage dies 610 can be implemented within the storage component 600. When the core storage dies 604 are determined to experience wear, data originally stored on one or more of the core storage dies 604 can be stored in one or more of the spare storage dies 610, thereby retiring the one or more core storage dies 604. Future operations targeting the one or more retired core storage dies 604 can instead target the one or more spare storage dies 610. In aspects, this die cycling to determine active storage dies used to stored data can be managed by the storage controller 606 without having to alert a memory controller (e.g., memory controller 210 illustrated in FIG. 2). Other form of wear leveling can also be performed by the storage controller 606. For example, the storage controller can map logical addresses at which data is stored to different physical addresses within the storage dies (e.g., core storage dies 604 or spare storage dies 610) to level the number of operations performed at each storage cell. In this way, the lifespan of the storage component 600 can be increased by reducing the peak wear at a particular storage cell.

The buffer die 602 can be used to store data returned from the core storage dies 604. As discussed above, the storage component 600 can return data with a higher latency than the memory dies. As a result, the data returned from the storage component 600 may need to be scheduled before being transmitted to the memory controller. For example, the return data can be stored in the buffer die 602 until a return of the data is scheduled. In some embodiments in which the DQ bus is shared with the memory dies, the return data can be buffered until it is determined that the DQ bus will be free for returning the return data. Once the DQ bus is free, the return data can be returned from the buffer to the memory controller. In some cases, the buffer die 602 can include DRAM or SRAM. In some embodiments, the storage component 600 can include additional components to implement hierarchical storage. For example, the storage component 600 can include a cache (e.g., implemented within the storage controller 606). In some cases, the cache can include SRAM.

As illustrated, the storage component 600 further includes the ECC die 608. The ECC die 608 can include ECC data that can be used to perform error correction. For example, the data stored in the storage component 600 can become corrupted (e.g., due to attacks or faults). The ECC data can include data usable to determine the accuracy of the data stored in the storage dies and, if an error is detected, recover the corrupted data. For example, the ECC data can include a hash of the data stored in the storage dies. The hash can be compared to the stored data. If the hash is valid, the data can be determined to be accurate. Otherwise, the data can be determined to be corrupted. The ECC die 608 can couple to all TSVs 612 in the storage component 600 such that ECC data can be accessed in conjunction with each operation at the storage dies. In other cases, only some the TSVs 612 can connect to the ECC die 608. It is appreciated that various techniques are usable for error correction. Thus, the ECC die 608 can store data to perform any type of error correction operation.

Although the storage controller 606 is described as performing certain functions, other functions can be performed. For example, the storage controller 606 can perform any operation that can be performed within a storage device or memory device. In general, the storage controller 606 can be responsible for controlling operations of the storage component 600 (e.g., reads, writes, error correction, wear leveling, or scheduling). Thus, it is appreciated that the storage controller 606 can be adapted to provide additional functionality.

FIG. 7 illustrates an example schematic routing diagram 700 of a memory device in accordance with an embodiment of the present technology. As illustrated in the schematic routing diagram 700, a memory controller 702 couples with the memory dies 704 and the storage controller 706 through a shared bus 714, at least partially implemented using the TSVs 710. In this way, a large bus can be implemented within the spatial constraints of the memory device and like signaling can be issued to both the memory dies 704 and the storage controller 706. The shared bus 714 can be implemented within TSVs 710. The shared bus 714 can include shared CA buses or shared DQ buses. In some implementations, the CA buses are shared between the memory dies 704 and the storage controller 706 while the DQ buses are discrete buses, or vice versa.

Given that the shared bus 714 is coupled to both the memory dies 704 and the storage controller 706, the memory dies 704 and the storage controller 706 can communicate at a same bandwidth. In FIG. 7, the width of various portions of the shared bus 714 are equal to "n," where n is a positive integer of bits. As illustrated, a first portion of the shared bus 714 connects to a first memory die of the memory dies 704, a second portion of the shared bus 714 connects to a second memory die of the memory dies 704, and a third and fourth portion of the shared bus 714 connect to a third and fourth memory die of the memory dies 704, respectively. Thus, the total bus width of the shared bus 714 is 4n. Each of the portions of the shared bus 714 couple with the storage controller 706. In this way, the storage controller 706 can communicate at the same bandwidth as the memory dies 704 collectively.

The shared bus 714 can couple with circuitry at the storage controller 706. In this way, the storage controller 706 can receive commands from the memory controller 702, similar to the memory dies 704. In some cases, the storage controller 706 and the memory dies 704 can be addressed such that the memory dies 704 and the storage controller 706 receive and perform operations in response to the same commands. Alternatively or additionally, the storage controller 706 and the memory dies 704 can be controlled separately using different commands.

The storage controller 706 can receive commands from the memory controller 702 and issue commands to the storage dies 708 through CA buses implemented using the TSVs 712. The TSVs 712 can also implement DQ buses through which data can be returned to the storage controller 706. The CA buses or the DQ buses can be divided across the various storage dies 708. For example, the CA buses or the DQ buses can be divided into groups of buses that connect to each of the core storage dies. In some embodiments, one or more of the storage dies 708 can connect to each of the CA buses or the DQ buses. For example, the buffer die, spare dies, or ECC die can couple with all or a subset of the CA buses or the DQ buses. The storage controller 706 can be responsible for issuing the commands to the storage dies 708 with proper timing or addressing. The storage controller 706 can further be responsible for controlling one or more operations associated with the operation at the storage dies 708 (e.g., wear leveling or error correction). Once the data is returned from the storage dies 708, the storage controller 706 can be responsible for scheduling the return of the data to the memory controller 702.

In aspects, given that the shared bus 714 can include a shared DQ bus common to the memory dies 704 and the storage controller 706, the storage controller 706 can return data directly to the memory dies 704, or vice versa, exclusive of the data passing through the memory controller 702. For example, the data can be returned from the storage controller 706 on a DQ bus shared with one or more of the memory dies 704. The memory dies 704 can listen for data communicated across the shared DQ bus and write the data to memory. In some cases, the storage controller 706 can issue a command to one or more of the memory dies 704 that share the DQ bus to cause the memory dies to receive data on the DQ bus and write the data to memory. In other cases, the memory controller 702 can be responsible for issuing a command to the memory dies 704 to receive data from the storage controller 706 on the shared DQ bus and write the data to memory. The command from the memory controller 702 can be issued based on the latency of the storage component or in response to signaling from the storage controller that indicates that data is to be returned on the shared DQ bus. In other cases, the data can be returned from the storage controller 706 to the memory controller 702 and the data can be transmitted from the memory controller 702 to the memory dies 704 to be stored in the memory dies 704.

Figure 8:
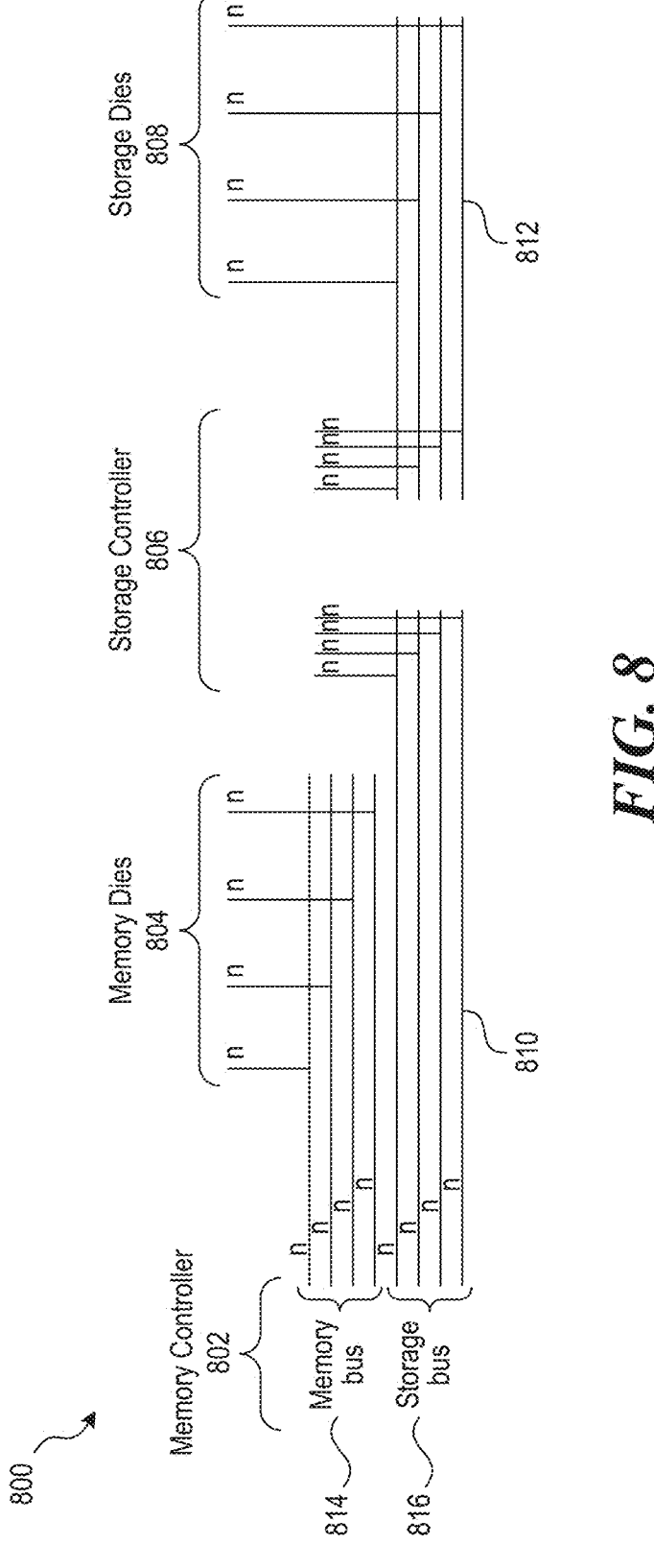
FIG. 8 illustrates an example schematic routing diagram of a memory device in accordance with an embodiment of the present technology.

FIG. 8 illustrates an example schematic routing diagram 800 of a memory device in accordance with an embodiment of the present technology. In contrast to the memory device illustrated in FIG. 7, the memory device illustrated in FIG. 8 includes discrete buses for the memory dies 804 and the storage controller 806. Specifically, the memory device includes a memory bus 814 coupling the memory controller 802 to the memory dies 804 and a storage bus 816 coupling the memory controller 802 to the storage controller 806. The memory bus 814 and the storage bus 816 can be implemented using different subsets or portions of the TSVs 810. The memory bus 814 and the storage bus 816 can include CA buses or DQ buses. Similarly, the TSVs 812 can implement CA buses or DQ buses coupled with the storage dies 808.

In general, the memory bus 814 and the storage bus 816 can function similarly to the shared bus 714 described with respect to FIG. 7. Due to the buses being separate, however, commands or data can be communicated to/from the memory dies 804 and to/from the storage controller 806 at a same time. Moreover, data cannot be communicated directly between the storage controller 806 and the memory dies 804. Instead, data can be communicated between the storage controller 806 and the memory dies 804 through the memory controller 802. In aspects, although the memory bus 814 and the storage bus 816 are not shared, the storage controller 806 and the memory dies 804 can communicate using a same bandwidth (e.g., the bus widths are the same).

Example Method for Operating a Memory Device

FIG. 9 illustrates an example method 900 for operating a memory device in accordance with an embodiment of the present technology. Although illustrated in a particular configuration, one or more operations of the method 900 may be omitted, repeated, or reorganized. Additionally, the method 900 may include other operations not illustrated in FIG. 9, for example, operations detailed in one or more other methods described herein. The operations described herein may be implemented in hardware, software executed by a processor, firmware, or any combination thereof. For instance, the operations can be performed by control logic at a storage controller of the memory device (e.g., storage controller 214 illustrated in FIG. 2).

At 902, a command to perform a first operation at a storage component location of a memory device is received from a first logic die of the memory device and through a first TSV. The first logic die can include a memory-side memory controller (e.g., the memory controller 210 illustrated in FIG. 2). For example, the memory controller can include an interface die of an HBM device. The first operation can include a storage operation, such as a read or write operation. The first TSV can include a shared TSV that implements a CA bus for a memory die of the memory device and a storage controller of the memory device.

At 903, a storage die corresponding to the storage component location is identified. In aspects, the first logic die issues the command to perform the first operation at a particular location but is unaware of which storage die is associated with that location. Instead, the storage controller can manage the association of storage dies with addresses. For instance, the storage controller can assign some storage dies (or portions of storage dies) as active storage dies used for data storage, spare storage dies to replace the active storage dies in response to wear on one of the active storage dies, ECC dies storing data that can be used to perform one or more ECC operations, and the like. In embodiments, to determine the location of the requested data, the storage controller may evaluate a location or address provided by the memory controller and determine in which of the storage dies the requested data is located. The determination by the storage controller 506 may be based on address translation, for example in response to wear leveling, bad storage die replacement, utilizing a redundant storage die, etc. In this way, the storage controller can map logical addresses within commands received from the memory controller to physical addresses within the storage dies.

At 904, a command to perform the first operation at the storage die is transmitted to the storage die using a second TSV. The second TSV can implement a CA bus within a storage component of the memory device. The command to perform the first operation at the storage die can be transmitted to a physical address determined at 903 with appropriate timing. For example, in response to receiving the command using the first TSV, the storage controller can postpone issuance of the command to perform the first operation at the storage die to reduce contention. The command to perform the first operation can also include one or more commands to perform one or more other operations within the storage component. For example, the storage controller can cause ECC data to be received from an ECC die of the storage component to enable error correction to be performed.

At 906, data resulting from performing the first operation at the storage die is received from the storage die and through a third TSV. The third TSV can implement a DQ bus that communicates data from the storage die to the storage controller. In some cases, the storage controller can perform one or more operations on the data. For example, the data can be stored in a buffer until a DQ bus is available to transmit the data to the memory controller. In other cases, the storage controller can perform an error correction operation using ECC data returned with the return data.

At 908, the data resulting from performing the first operation at the storage die is transmitted to the first logic die using a fourth TSV. The fourth TSV can be shared between one or more memory dies of the memory device and the storage controller to implement a shared DQ bus. In some cases, the data resulting from performing the first operation can be communicated directly to the one or more memory dies using the shared DQ bus exclusive of the first logic die. For example, the one or more memory dies can receive data from the storage controller communicated on the shared DQ bus and store the data in one or more memory cells of the memory dies. In general, the storage controller can schedule the transmission of the return data. For example, the storage controller can determine when the DQ bus is free to transmit the return data and transmit the return data on the DQ bus at this time. In doing so, a memory device with a storage component can be implemented.

From the foregoing, it will be appreciated that specific embodiments of the technology have been described herein for purposes of illustration, but well-known structures and functions have not been shown or described in detail to avoid unnecessarily obscuring the description of the embodiments of the technology. To the extent any material incorporated herein by reference conflicts with the present disclosure, the present disclosure controls. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Furthermore, as used herein, the phrase "and/or" as in "A and/or B" refers to A alone, B alone, and both A and B. Additionally, the terms "comprising," "including," "having," and "with" are used throughout to mean including at least the recited feature(s) such that any greater number of the same features and/or additional types of other features are not precluded. Further, the terms "generally", "approximately," and "about" are used herein to mean within at least within 10 percent of a given value or limit. Purely by way of example, an approximate ratio means within ten percent of the given ratio.

Several implementations of the disclosed technology are described above in reference to the figures. The computing devices on which the described technology may be implemented can include one or more central processing units, memory, input devices (e.g., keyboard and pointing devices), output devices (e.g., display devices), storage devices (e.g., disk drives), and network devices (e.g., network interfaces). The memory and storage devices are computer-readable storage media that can store instructions that implement at least portions of the described technology. In addition, the data structures and message structures can be stored or transmitted via a data transmission medium, such as a signal on a communications link. Thus, computer-readable media can comprise computer-readable storage media (e.g., "non-transitory" media) and computer-readable transmission media.

It will also be appreciated that various modifications may be made without deviating from the disclosure or the technology. For example, the dies in the described memory device (e.g., combined HBM device) can be arranged in any other suitable order (e.g., with the non-volatile memory die(s) positioned between the interface die and the volatile memory dies; with the volatile memory dies on the bottom of the die stack; and the like). Further, one of ordinary skill in the art will understand that various components of the technology can be further divided into subcomponents, or that various components and functions of the technology may be combined and integrated. In addition, certain aspects of the technology described in the context of particular embodiments may also be combined or eliminated in other embodiments. For example, although discussed herein as using a non-volatile memory die (e.g., a NAND die and/or NOR die) to expand the memory of the combined HBM device, it will be understood that alternative memory extension dies can be used (e.g., larger-capacity DRAM dies and/or any other suitable memory component). While such embodiments may forgo certain benefits (e.g., non-volatile storage), such embodiments may nevertheless provide additional benefits (e.g., reduce the traffic through the bottleneck, allowing many complex computation operations to be executed relatively quickly, etc.).

Furthermore, although advantages associated with certain embodiments of the technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A memory device comprising:
a plurality of stacked semiconductor dies comprising:
   a first logic die comprising circuitry configured to: transmit commands to one or more memory dies using first through-silicon vias (TSVs), transmit commands to a second logic die using second TSVs, receive data from the one or more memory dies using third TSVs, and receive data from the second logic die using fourth TSVs;
   the one or more memory dies comprising circuitry configured to receive commands from the first logic die using the first TSVs and return data to the first logic die using the third TSVs;
   the second logic die comprising circuitry configured to: receive commands from the first logic die using the second TSVs, return data to the first logic die using the fourth TSVs, transmit commands to one or more storage dies using fifth TSVs, and receive data from the one or more storage dies using sixth TSVs; and
   the one or more storage dies comprising circuitry configured to receive commands from the second logic die using the fifth TSVs and return data to the second logic die using the sixth TSVs;
   the first TSVs;
   the second TSVs;
   the third TSVs;
   the fourth TSVs;
   the fifth TSVs; and
   the sixth TSVs.

2. The memory device of claim 1, wherein the third TSVs and the fourth TSVs comprise common TSVs.

3. The memory device of claim 1, wherein the first TSVs and the second TSVs comprise common TSVs.

4. The memory device of claim 1, wherein the first TSVs and the fifth TSVs comprise a same number of TSVs.

5. The memory device of claim 1, further comprising an additional memory die comprising circuitry configured to receive the data returned using the sixth TSVs and buffer the data returned using the sixth TSVs.

6. The memory device of claim 1, wherein the circuitry of the second logic die is further configured to: map storage addresses of the one or more storage dies to different physical locations in the one or more storage dies to perform wear leveling of the one or more storage dies.

7. The memory device of claim 1, wherein:
the one or more storage dies comprise at least one active storage die and at least one spare storage die; and
the second logic die comprises circuitry configured to store, in one of the at least one spare storage die, data to be stored in one of the at least one active storage die.

8. The memory device of claim 1, wherein:
the one or more storage dies comprise a storage die configured to store error correction code (ECC) related to data stored in other storage dies of the one or more storage dies and return the ECC to the second logic die using the sixth TSVs; and
the second logic die comprises circuitry configured to perform an error correction operation using the ECC returned using the sixth TSVs.

9. The memory device of claim 1, wherein the first logic die and the second logic die have a same bandwidth.

10. The memory device of claim 1, wherein the commands transmitted on the fifth TSVs comprise a write command.

11. A memory device comprising:
a plurality of stacked semiconductor dies comprising:
   a first logic die comprising circuitry configured to: transmit commands to a plurality of dies and a second logic die using first TSVs and receive data from the plurality of memory dies and the second logic die using second TSVs;
   the plurality of memory dies comprising circuitry configured to receive commands from the first logic die using the first TSVs and return data to the first logic die using the second TSVs, the plurality of memory dies comprising:
      a first memory die coupled with a first set of the first TSVs but not a second set of the first TSVs; and
      a second memory die coupled with the second set of the first TSVs but not the first set of the first TSVs;
   the second logic die comprising circuitry configured to: receive commands from the first logic die using the first TSVs, return data to the first logic die using the second TSVs, transmit commands to one or more storage dies using third TSVs, and receive data from the one or more storage dies using fourth TSVs, the second logic die coupled with the first set of the first TSVs and the second set of the first TSVs; and
   the one or more storage dies comprising circuitry configured to receive commands from the second logic die using the third TSVs and return data to the second logic die using the fourth TSVs;
   the first TSVs;
   the second TSVs;
   the third TSVs; and
   the fourth TSVs.

12. The memory device of claim 11, wherein the circuitry of the plurality of memory dies is further configured to receive, using the second TSVs, data returned from the second logic die on the second TSVs, wherein the data is received directly from the second logic die exclusive of transmission of the data from the first logic die.

13. The memory device of claim 11, wherein:
the plurality of memory dies comprises dynamic random-access memory (DRAM) dies; and
the one or more storage dies comprise NOT-AND (NAND) Flash storage dies.

14. The memory device of claim 11, wherein the memory device comprises a high-bandwidth memory (HBM) device.

15. A memory device comprising:
a plurality of stacked semiconductor dies comprising:
   a first logic die comprising circuitry configured to: transmit commands to one or more dynamic random-access memory (DRAM) dies using at least one first command-address (CA) bus, transmit commands to a second logic die using at least one second CA bus, receive data from the one or more DRAM dies using at least one first data (DQ) bus, and receive data from the second logic die using at least one second DQ bus;
   the one or more DRAM dies comprising circuitry configured to receive commands using the at least one first CA bus and return data using the at least one first DQ bus;
   the second logic die comprising circuitry configured to: receive commands using the at least one second CA bus, return data using the at least one second DQ bus, transmit commands to one or more NOT-AND (NAND) dies using at least one third CA bus, and receive data from the one or more NAND dies using at least one third DQ bus; and the one or more NAND dies comprising circuitry configured to receive commands using the at least one third CA bus and return data using the at least one third DQ bus;

the at least one first CA bus;

the at least one second CA bus;

the at least one third CA bus;

the at least one first DQ bus;

the at least one second DQ bus; and the at least one third DQ bus.

16. The memory device of claim 15, wherein the at least one first DQ bus and the at least one second DQ bus comprises a same DQ bus.

17. The memory device of claim 15, wherein the first logic die and the second logic die have a same bandwidth.

18. The memory device of claim 15, further comprising an additional DRAM die comprising circuitry configured to receive the data returned using the at least one third DQ bus and buffer the data returned using the at least one third DQ bus.

19. The memory device of claim 15, wherein:

the one or more NAND dies comprise at least one active NAND die and at least one spare NAND die; and the second logic die comprises circuitry configured to store, in one of the at least one spare NAND die, data to be stored in one of the at least one active NAND die.

20. The memory device of claim 15, wherein:

the one or more NAND dies comprise a NAND die configured to store error correction code (ECC) related to data stored in other NAND dies of the one or more NAND dies and return the ECC to the second logic die using the at least one third DQ bus; and the second logic die comprises circuitry configured to perform an error correction operation using the ECC returned using the at least one third DQ bus.

\* \* \* \* \*